(12) United States Patent
Tu et al.

(10) Patent No.: US 11,531,059 B2
(45) Date of Patent: Dec. 20, 2022

(54) TESTING DEVICE FOR BURN-IN TEST OPERATIONS AND CONTROL METHOD THEREOF

(71) Applicant: SILICONWARE PRECISION INDUSTRIES CO., LTD., Taichung (TW)

(72) Inventors: Chao-Ming Tu, Taichung (TW); Chih-Ming Yang, Taichung (TW); Wen-Chin Liang, Taichung (TW); Cheng-Shao Chen, Taichung (TW); Yung-Ming Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 27 days.

(21) Appl. No.: 17/169,769

(22) Filed: Feb. 8, 2021

(65) Prior Publication Data
US 2022/0214395 A1 Jul. 7, 2022

(30) Foreign Application Priority Data
Jan. 7, 2021 (TW) .................. 110100602

(51) Int. Cl.
*G01R 31/28* (2006.01)
*G01R 1/44* (2006.01)
(52) U.S. Cl.
CPC ........... *G01R 31/2849* (2013.01); *G01R 1/44* (2013.01)
(58) Field of Classification Search
CPC ............ G01R 31/2863; G01R 31/2856; G01R 31/2874; G01R 1/0483; G01R 31/2875; G01R 31/2893; G01R 1/0408; G01R 31/26; G01R 31/2855; G01R 31/2862; G01R 31/2849; G01R 31/2877; G01R 1/0458; G01R 31/2817; G01R 31/318511; G01R 31/2865; G01R 31/2896; G01R 31/2872; G01R 31/2851; G01R 31/003; G01R 31/2881; G01R 31/31724; G01R 31/318577; G01R 1/44; F04C 2270/041; G01K 3/005; G01K 1/14; G01K 13/00; G01K 17/00; G01K 7/425; G01N 17/002; G01N 2203/0222; G01N 25/00; G01N 25/20; F24F 7/007; F24F 11/77; F24F 2221/54; F24F 3/00; F28D 15/043; F28D 1/06; F28D 15/046; F28D 15/06

See application file for complete search history.

(56) References Cited

U.S. PATENT DOCUMENTS

| | | | | |
|---|---|---|---|---|
| 3,602,429 A | * | 8/1971 | Levedahl | F28D 15/06 237/9 R |
| 8,151,872 B2 | * | 4/2012 | Di Stefano | F28F 27/00 165/80.4 |
| 9,366,721 B2 | * | 6/2016 | Teoh | G01R 31/2877 |

(Continued)

*Primary Examiner* — Vinh P Nguyen
(74) *Attorney, Agent, or Firm* — Kelly & Kelley, LLP

(57) ABSTRACT

A control method is provided and used to place a target object on a test platform in a cabin of a testing device, to sense the temperature of the target object by a temperature response structure, and then to receive temperature signals of the temperature response structure by a controller, where the controller can regulate the pressure inside the cabin to control the air pressure of the cabin, so that the target object can still maintain good heat dissipation under high power consumption.

16 Claims, 8 Drawing Sheets

(56) References Cited

U.S. PATENT DOCUMENTS

| | | | | |
|---|---|---|---|---|
| 9,477,287 | B1* | 10/2016 | Schow | G06F 1/32 |
| 10,499,540 | B2* | 12/2019 | North | G06F 1/324 |
| 10,670,293 | B2* | 6/2020 | Abiprojo | F24F 11/65 |
| 11,061,069 | B2* | 7/2021 | Gopal | G01R 1/0458 |
| 2019/0162777 | A1* | 5/2019 | Chiang | G01R 31/2875 |

* cited by examiner

TESTING DEVICE FOR BURN-IN TEST OPERATIONS AND CONTROL METHOD THEREOF

BACKGROUND

1. Technical Field

The present disclosure relates to a mechanism for controlling a test environment, and more particularly, to a testing device applicable to burn-in test operations and a control method thereof.

2. Description of Related Art

Generally speaking, electronic components such as memories and central processing units (CPUs) are installed on motherboards of electronic products to perform specific tasks. During the manufacturing process of these electronic components, the electronic components have to undergo numerous tests, such as a burn-in test that is used for verifying the reliability of high-performance chips, which makes sure that the high-performance chips are compliant with the design specifications and can operate normally in high temperature environment. However, as integration of electronic products increases, the power consumption requirements of the electronic products have also increased. As a result, heat dissipation requirements of test machines under high temperature environment also becoming higher.

However, existing burn-in test machines are designed to have constant pressure and cannot meet the heat dissipation speed required by high power consumption products. This means that the environmental conditions of the burn-in test operations do not meet the test requirements.

Therefore, there is a need for a solution that addresses the aforementioned issues of the prior art.

SUMMARY

In view of the aforementioned shortcomings of the prior art, the present disclosure provides a testing device, which includes: a cabin equipped with a test platform therein for placing a target object; a temperature response structure for sensing a temperature of the target object; and a controller communicatively connected with the temperature response structure for receiving temperature signals of the temperature response structure and controlling an internal pressure of the cabin.

The present disclosure further provides a control method, which includes: providing a cabin equipped with a test platform therein; placing a target object on the test platform; sensing a temperature of the target object by a temperature response structure; and receiving temperature signals of the temperature response structure and controlling an internal pressure of the cabin by a controller.

In the aforementioned testing device and control method, the cabin is used for a burn-in test operation, and a temperature control component is disposed on the test platform and communicatively connected with the controller for adjusting the temperature of the target object. For example, the temperature control component includes at least one of a temperature increasing element and a temperature decreasing element, wherein the temperature increasing element is a heater, and the temperature decreasing element is at least one of a fan and a heat sink. Furthermore, the controller defines a target temperature range, and when a test temperature indicated by the temperature signals of the temperature response structure fails to fall within the target temperature range, the temperature of the target object is adjusted by the temperature control component.

In the aforementioned testing device and control method, the controller defines a target temperature range, and when a test temperature indicated by the temperature signals of the temperature response structure fails to fall within the target temperature range, the internal pressure of the cabin is adjusted by the controller.

The aforementioned testing device and control method further include collecting, by a database, power consumption data associated with the target object that are used by the controller to control the internal pressure of the cabin.

The aforementioned testing device and control method further include detecting, by a detection structure, at least one of a current and a voltage of the target object, and at least one of the current and the voltage of the target object is converted to power consumption by the controller. For example, the controller adjusts the internal pressure of the cabin based on the power consumption.

As can be understood from the above, in the testing device in accordance with the present disclosure and the control method thereof, the pressure inside the cabin can be regulated by the controller to control the air pressure in the cabin. As a result, good heat dissipation can be maintained for the testing device even under high power consumption. Therefore, compared to the prior art, the testing device in accordance with the present disclosure and the control method thereof, when applied to a burn-in test operation, can achieve stable temperature control.

Moreover, the testing device in accordance with the present disclosure and the control method thereof also sense in real time the temperature of the target object by using a temperature response structure, and the sensed data can be fed back to the controller in real time to allow the controller to adjust the air pressure inside the cabin in real time, and thus the temperature of the target object can be further controlled.

BRIEF DESCRIPTION OF THE DRAWINGS

FIG. 1' is a flowchart illustrating activation of a temperature control mechanism in accordance with the present disclosure.

FIG. 2A' is a schematic perspective plane view illustrating a cabin of a testing device in accordance with the present disclosure.

DETAILED DESCRIPTION

Figure 1:
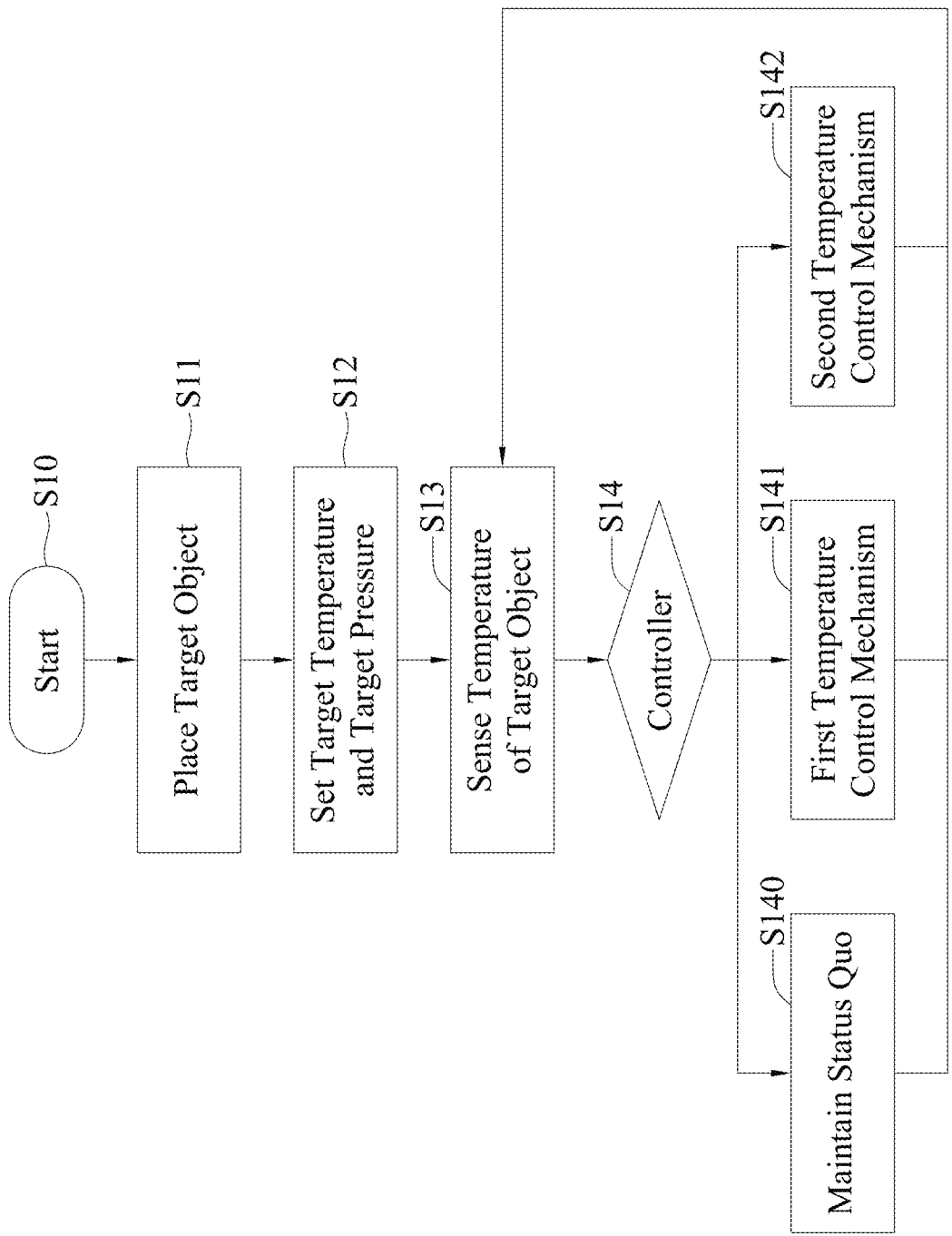
FIG. 1 is a flowchart illustrating a control method in accordance with the present disclosure.
Figure 1:
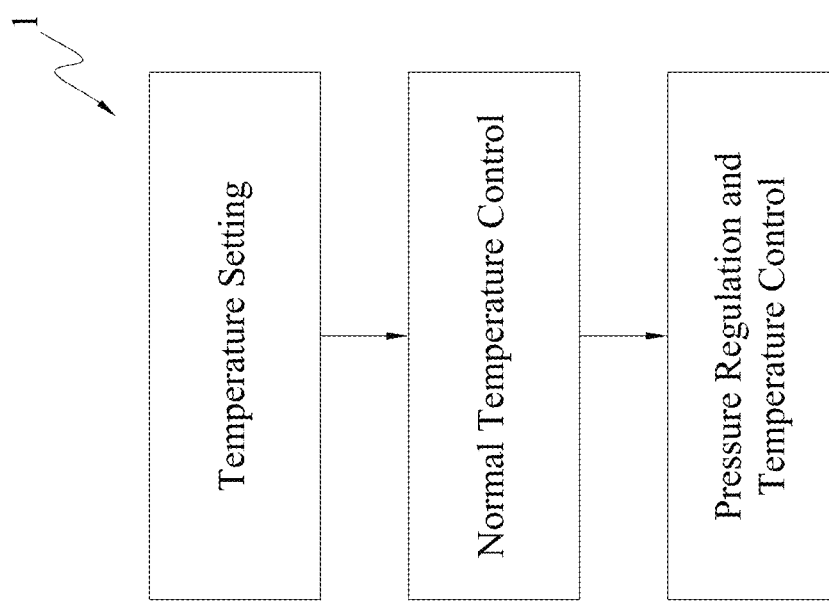

The implementations of present disclosure are illustrated using the following specific embodiments. One of ordinary skill in the art can readily appreciate other advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and the objectives achieved by the present disclosure, any modifications, changes or adjustments to the structures, ratio relationships or sizes, are to be construed as falling within the range covered by the technical contents disclosed herein. Meanwhile, terms such as "first," "second," "above," "below," "a," "an," and the like, are for illustrative purposes, and are not meant to limit the scope in which the present disclosure can be implemented. Any variations or modifications made to their relative relationships, without changing the substantial technical content, are also to be considered as within the scope in which the present disclosure can be implemented.

FIG. 1 is a flowchart illustrating a control method in accordance with the present disclosure. In an embodiment, the control method is applicable to the control of environmental conditions of a burn-in test operation so as to regulate the temperature and/or pressure of the burn-in test operation.

Figure 2A:
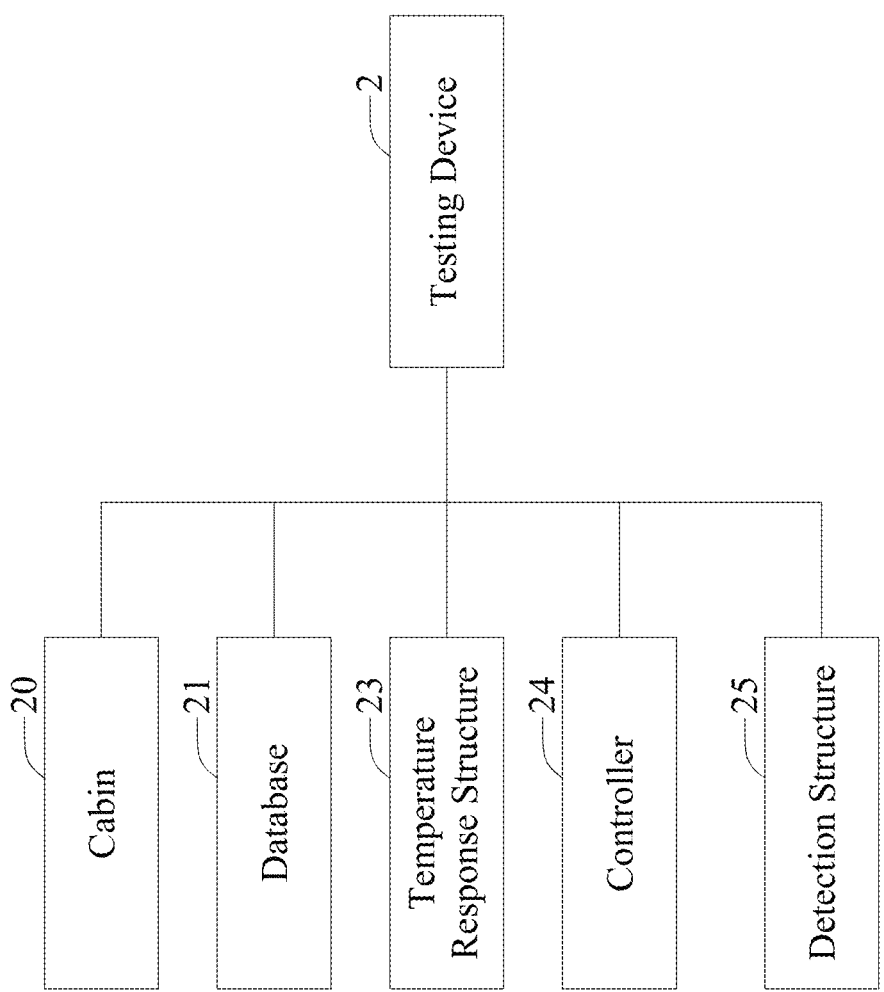
FIG. 2A is a schematic diagram illustrating a testing device in accordance with the present disclosure.
Figure 2A:
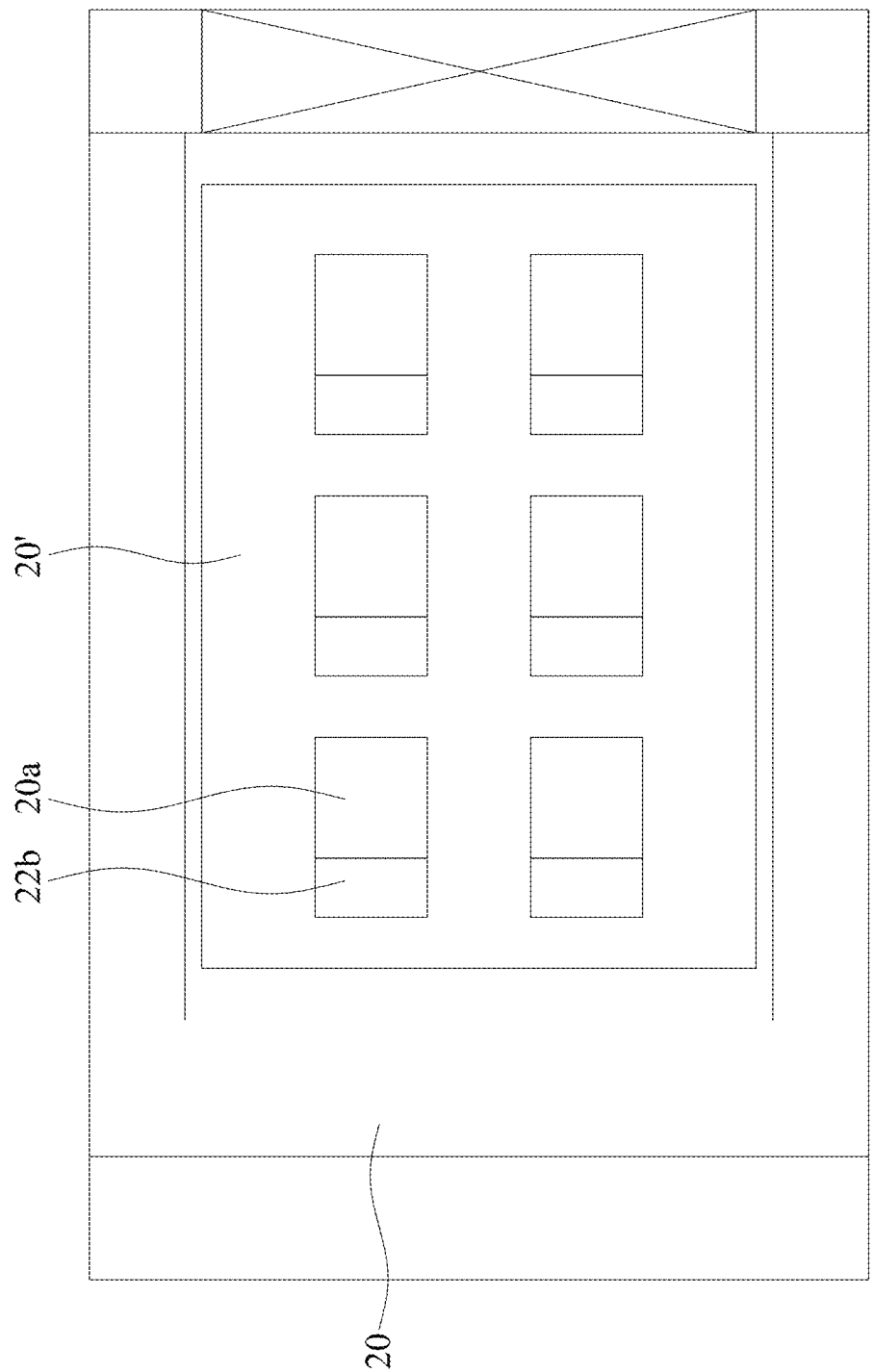

In step S10, a testing device 2 for a burn-in test operation is provided. As shown in FIG. 2A and FIG. 2A', the testing device 2 includes a cabin 20, a temperature control component 22 disposed on the cabin 20 (as shown in FIGS. 2B and 2C), at least one temperature response structure 23 for sensing the temperature of a target object 9 (as shown in FIGS. 2B and 2C), and a controller 24 communicatively connected with the temperature response structure 23 and the temperature control component 22, wherein the controller 24 regulates the pressure inside the cabin 20.

In an embodiment, the cabin 20 is used for the burn-in test operation. At least one test platform 20a is provided therein, and the temperature control component 22 is provided on the test platform 20a to adjust the temperature of the target object 9.

Figure 2C:
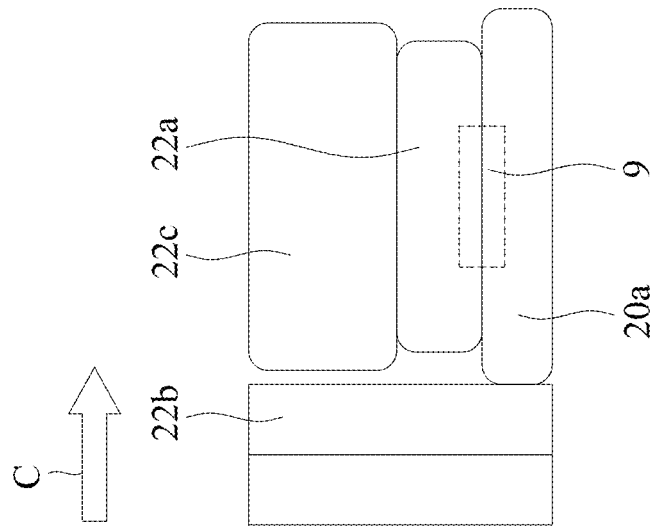
FIG. 2C is a schematic partial side view of FIG. 2A'.
Figure 2B:
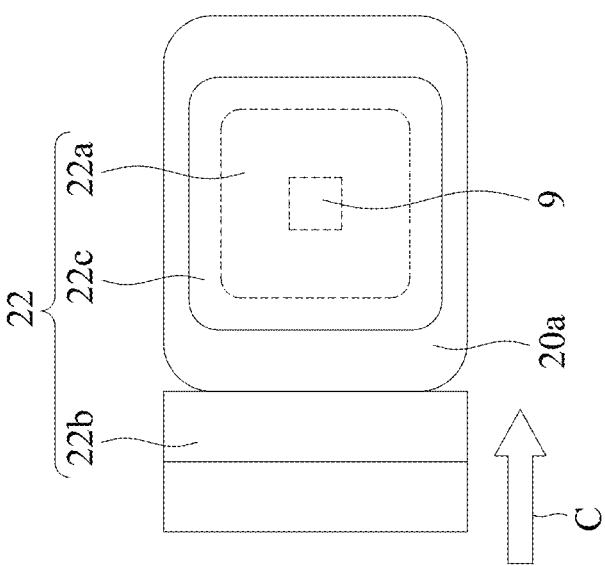
FIG. 2B is a schematic partial top view of FIG. 2A'.

Moreover, the temperature control component 22 includes a temperature increasing element and/or a temperature decreasing element, wherein the temperature increasing element can be a heater 22a shown in FIGS. 2B and 2C, and the temperature decreasing element can be a fan 22b and/or a heat sink 22c shown in FIGS. 2B and 2C.

In addition, the temperature response structure 23 can be a temperature sensing mechanism, such as a temperature sensing circuit provided on a circuit board 20' in the cabin 20 and electrically connected with the target object 9.

It can be appreciated that there are numerous types of machines used for burn-in test operations, and their basic configurations are well-known in the art. Therefore, the standard components of the testing device 2 used for a burn-in test operation will not be further illustrated.

In step S11, a single target object 9 (shown in FIGS. 2B and 2C) is provided on the single test platform 20a.

In an embodiment, the target object 9 includes an electronic package. For example, the electronic package has at least one electronic component and an encapsulation layer encapsulating the electronic component. Specifically, the electronic package is a CPU or a memory, and the electronic component is a semiconductor chip.

Furthermore, the heater 22a can be stacked on top of the target object 9 and in contact with the target object 9. As shown in FIG. 2C, the heat sink 22c is a heat sink with fins that is stacked on top of the heater 22a.

In addition, the fan 22b is disposed at one of the sides of the test platform 20a that sends cold air or airflow C towards the target object 9 (as shown in FIG. 2B or 2C). For example, the fan 22b sends the cold air or airflow towards the target object 9, the heater 22a and the heat sink 22c. It can be appreciated that there are many types of fans, and the structure of the fan 22b is not limited to a particular type.

Figure 3:
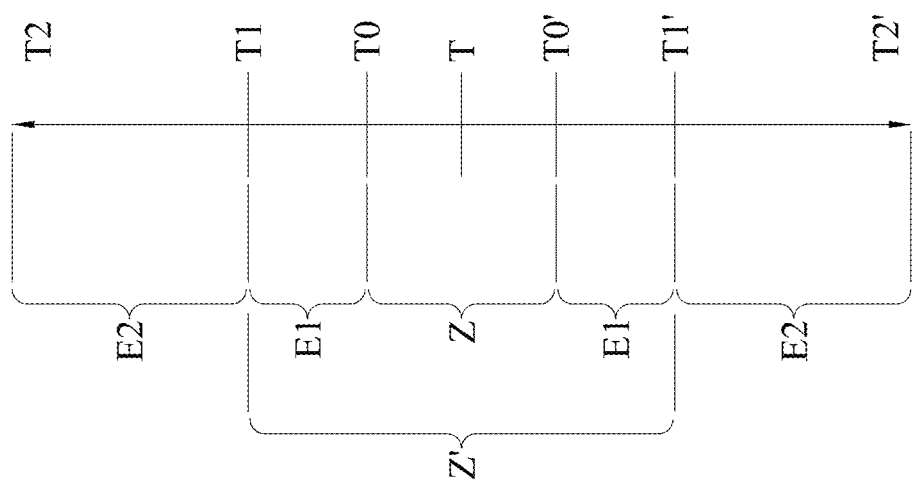
FIG. 3 is a schematic diagram depicting a determining criteria of the control method in accordance with the present disclosure.

In step S12, through a user interface of the testing device 2, for example, a target temperature T is set in the controller 24, as shown in FIG. 3, the testing device 2 starts to increase (or decrease) the temperature of the target object 9 to the target temperature T. In addition, a target pressure (e.g., initial air pressure or atmospheric temperature) inside the cabin 20 is set.

In an embodiment, the controller 24 defines reasonable temperatures T0, T0' that allows positive and negative temperature differences based on the target temperature T. As shown in FIG. 3, the respective difference between the reasonable temperatures T0, T0' and the target temperature T is defined as a reasonable temperature difference range (or the range between the reasonable temperatures is defined as a first target temperature range Z); the controller 24 defines first excess temperatures T1, T1' that exceed certain positive and negative temperature values, the respective difference between the first excess temperatures T1, T1' and the reasonable temperatures T0, T0' is defined as a first temperature control range E1 (or the range between the first excess temperatures T1, T1' is defined as a second target temperature range Z'); the controller 24 further defines second excess temperatures T2, T2' that exceed certain positive and negative temperature values, the respective difference between the second excess temperatures T2, T2' and the first excess temperatures T1, T1' is defined as a second temperature control range E2.

In step S13, the temperature of the target object 9 on the test platform 20a is sensed by the temperature response structure 23.

In step S14, temperatures signals of the temperature response structure 23 are received by the controller 24.

In an embodiment, under the condition of single power consumption (i.e., no power consumption changes are generated), a temperature control mechanism to be adopted by the controller 24 is determined based on the temperature signals of the temperature response structure 23.

Under normal conditions, as in step S140, the test temperature (or the temperature of the target object 9) indicated by the temperature signals of the temperature response structure 23 is the target temperature T (or within the reasonable temperature difference range or the first target temperature range Z). Therefore, in this case, the controller 24 will maintain the status quo and will not adjust the temperature of the target object 9.

Under the condition of a first environmental temperature, as in step S141, when the test temperature indicated by the temperature signals of the temperature response structure 23 is greater than or less than the target temperature T (or greater than the reasonable temperature T0 or less than the reasonable temperature T0', i.e., when the test temperature exceeds the reasonable temperature difference range or the first target temperature range Z), in other words, when the test temperature is the first excess temperature T1, T1' or within the first temperature control range E1, the temperature of the target object 9 is adjusted by the temperature control component 22. For example, a first temperature control mechanism is adopted by the controller 24, that is, when the test temperature is too low, the heater 22a is activated to increase the temperature, or when the test temperature is too high, the fan 22c is activated to reduce the temperature, such that the test temperature is adjusted to the target temperature T or the reasonable temperature T0, T0'(i.e., within the reasonable temperature difference range or the first target temperature range Z).

Under the condition of a second environmental temperature, as in step S142, when the test temperature indicated by the temperature signals of the temperature response structure 23 is greater than or less than the target temperature T (or greater than the first excess temperature T1 or less than the first excess temperature T1', i.e., when the test temperature exceeds the first temperature control range E1 or the second target temperature range Z'), the temperature of the target object 9 is adjusted by the temperature control component 22, and the pressure inside the cabin 20 is adjusted by the controller 24. For example, after the first temperature control mechanism was adopted by the controller 24, the test temperature sensed by the temperature response structure 23 is still too high or too low, i.e., the test temperature is the second excess temperature T2, T2' or within the second temperature control range E2, then a second temperature control mechanism is adopted by the controller 24 to adjust the pressure inside the cabin 20. Specifically, when the test temperature is too high (e.g., the second excess temperature T2), pressure is increased, or when the test temperature is too low (e.g., the second excess temperature T2'), pressure is decreased, and the heater 22a remains activated to increase the temperature or the fan 22c remains activated to decrease the temperature, such that the test temperature is adjusted to the target temperature T or the reasonable temperature T0, T0'(i.e., within the reasonable temperature difference range or the first target temperature range Z).

Furthermore, based on the principle that the higher the pressure, the greater the heat transfer coefficient, the control method is able to increase the heat dissipation speed by increasing the pressure, wherein the heat transfer coefficient $h=q/(A \cdot \Delta T)$, wherein q represents the heat influx or loss (in J/s=W); A represents heat conduction area (in $m^2$); and $\Delta T$ represents the temperature difference (in K) between the solid surface and the surrounding fluid. Thus, the unit of the heat transfer coefficient h is $W/(m^2 \cdot K)$.

Figure 4:
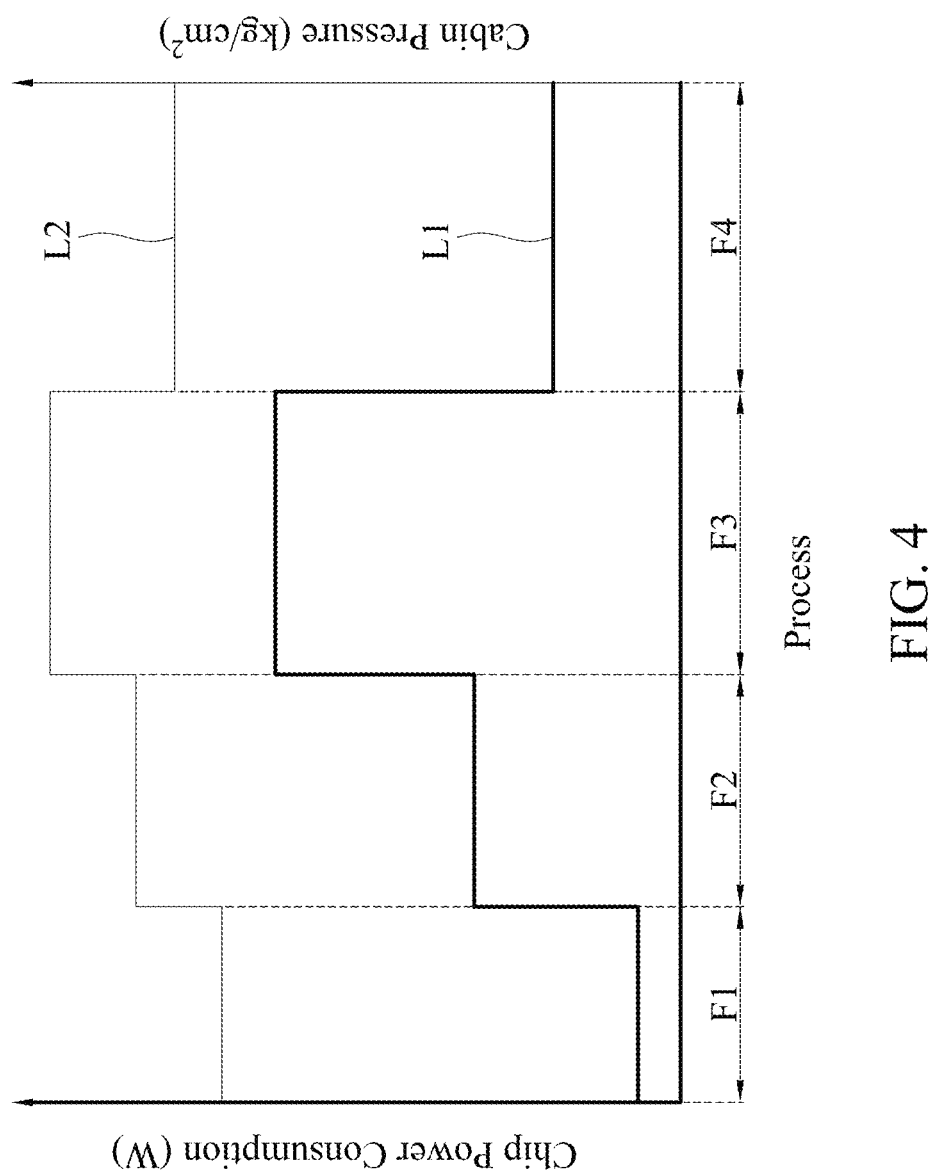
FIG. 4 is a schematic diagram depicting another determining criteria of the control method in accordance with the present disclosure.

Therefore, the burn-in test operation performs many different test items on a single target object 9, and the entire test process may take half an hour, or even 2 to 3 hours. The target object 9 may generate many power consumption changes during the various test processes, and the controller 24 can adjust (increase or decrease) the internal pressure of the cabin 20 (such as an internal pressure profile L2 of the cabin shown in FIG. 4) according to the power consumption changes (such as a power consumption profile L1 of the target object 9 or chip shown in FIG. 4), thereby altering the temperature of the target object 9. For example, in the entire process of the burn-in test operation, there are a plurality of stages (or a plurality of test items) F1, F2, F3, F4 (shown as four in FIG. 4), and each stage F1, F2, F3, F4 (or each test item) may generate different power consumption changes, so the control method can collect the various power consumption data in each burn-in test operation and store them in a database 21, so as to set an initial air pressure respectively for each stage F1, F2, F3, F4 (or each test item), and to fine tune the pressure during the test process of each stage F1, F2, F3, F4 (or each test item).

Alternatively, the control method may also adopt a real-time power consumption feedback approach. For example, the testing device 2 detects in real time the current and/or voltage of the target object 9 to calculate the power consumption of the target object 9, which can be used by both the testing device 2 for adjusting the air pressure (e.g., the internal pressure of the cabin 20) and the controller 24 for controlling or fine tuning the temperature.

Thus, the testing device 2 can be provided with a detection structure 25 communicatively connected with the controller 24, which can be used for detecting in real time the current and/or voltage of the target object 9. The controller 24 can then convert the current and/or voltage of the target object 9 into power consumption based on the following formula:

$$P=I \cdot V$$

wherein P represents power consumption; I represents current; and V represents voltage. As such, the controller 24 can adopt the second temperature control mechanism based on the power consumption in order to adjust the internal pressure of the cabin 20 and the temperature of the target object 9. For example, the detection structure 25 is a detection mechanism, such as a detection circuit disposed on the circuit board 20' in the cabin 20 and electrically connected with the target object 9.

Figure 5:
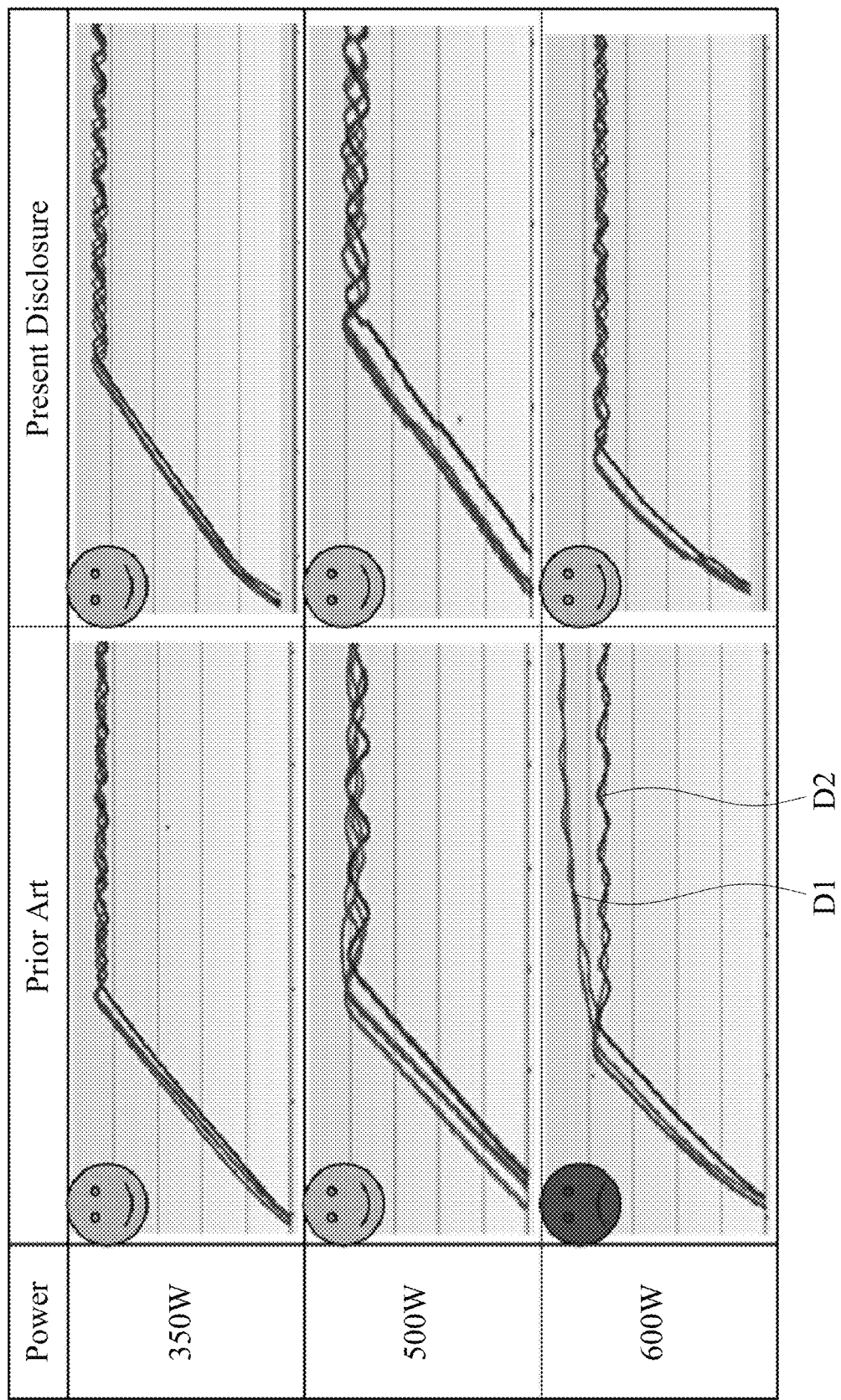
FIG. 5 is a table comparing tests conducted using the control method in accordance with the present disclosure and conventional tests.

In summary, in the testing device 2 in accordance with the present disclosure and the control method thereof, after the target temperature T is set (e.g., the temperature control mechanism 1 shown in FIG. 1'), with the operation of the temperature response structure 23, the controller 24 adopts the first temperature control mechanism to perform thermal regulation using the temperature control component 22 (e.g., the normal temperature control shown in FIG. 1'), such that the temperature of the target object 9 is maintained in the reasonable temperature difference range or the first target temperature range Z, and when the temperature of the target object 9 exceeds the controllable range (i.e., when the temperature of the target object 9 is the second excess temperature T2, T2' or within the second temperature control range E2), the controller 24 adopts the second temperature control mechanism to perform thermal regulation through altering of the atmospheric pressure and the temperature control component 22 (e.g., pressure regulation and temperature control or pressure increase and temperature control shown in FIG. 1'), such that the temperature of the target object 9 is maintained in the reasonable temperature difference range or the first target temperature range Z. As a result, the testing device 2 in accordance with the present disclosure and the control method thereof is capable of controlling the air pressure in the cabin 20 by regulating the internal pressure of the cabin 20 through the controller 24, so that even under the conditions of high power consumption (e.g., in the case of power consumption of 600 watts as shown in FIG. 5), good heat dissipation can still be maintained for the target object 9 (compared to the prior-art method wherein the pressure change profile D1 gradually diverges from the power consumption change profile D2 shown in FIG. 5), thereby achieving stable temperature control.

Moreover, during the entire process of the burn-in test operation, multiple power consumption behaviors will be generated due to different tests performed on the target object 9, the controller 24 can monitor the power consumption in real time to adjust the air pressure of the cabin 20, so as to achieve stable and dynamic temperature control.

Furthermore, the testing device 2 in accordance with the present disclosure and the control method thereof is also capable of presetting an initial air pressure for each of the test item (e.g., for each stage F1, F2, F3, F4 shown in FIG. 4) by collecting power consumption data, and conducting a temperature control mechanism during the test process of each stage F1, F2, F3, F4 as shown in FIG. 3 (e.g., the second temperature control mechanism that includes pressure fine tuning).

In addition, during the process of the burn-in test operation, the testing device 2 can determine if the temperature of the target object 9 exceeds a certain threshold by using the temperature response structure 23, which can be fed back to the controller 24 in real time to allow the controller 24 to adjust the air pressure inside the cabin 20 in real time. As a result, the heat dissipation mechanism required by the test environment (e.g., inside of the cabin 20) of the burn-in test operation can be controlled.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A testing device, comprising:
   a cabin equipped with a test platform therein for placing a target object;
   a temperature response structure for sensing a temperature of the target object;
   a controller communicatively connected with the temperature response structure for receiving temperature signals of the temperature response structure and controlling an internal pressure of the cabin to a pressure value corresponding to the temperature signals; and
   a detection structure communicatively connected with the controller for detecting at least one of a current and a voltage of the largest object, wherein at least one of the current and the voltage of the target object is converted to power consumption by the controller, such that the controller adjusts the internal pressure of the cabin based on the power consumption.

2. The testing device of claim 1, wherein the cabin is used for a burn-in test operation, and a temperature control component is disposed on the test platform and communicatively connected with the controller for adjusting the temperature of the target object.

3. The testing device of claim 2, wherein the temperature control component includes at least one of a temperature increasing element and a temperature decreasing element.

4. The testing device of claim 3, wherein the temperature increasing element is a heater.

5. The testing device of claim 3, wherein the temperature decreasing element is at least one of a fan and a heat sink.

6. The testing device of claim 2, wherein the controller defines a target temperature range, and when a test temperature indicated by the temperature signals of the temperature response structure fails to fall within the target temperature range, the temperature of the target object is adjusted by the temperature control component.

7. The testing device of claim 1, wherein the controller defines a target temperature range, and when a test temperature indicated by the temperature signals of the temperature response structure fails to fall within the target temperature range, the internal pressure of the cabin is adjusted by the controller.

8. The testing device of claim 1, further comprising a database communicatively connected with the controller for collecting power consumption data of the target object, wherein the power consumption data of the target object are used by the controller to control the internal pressure of the cabin.

9. A control method, comprising:
   providing a cabin equipped with a test platform therein;
   placing a target object on the test platform;
   sensing a temperature of the target object by a temperature response structure;
   receiving temperature signals of the temperature response structure and controlling an internal pressure of the cabin to a pressure value corresponding to the temperature signals by a controller; and
   detecting, by a detection structure, at least one of a current and a voltage of the target object, wherein at least one of the current and the voltage of the target object is converted to power consumption by the controller, such that the controller adjusts the internal pressure of the cabin based on the power consumption.

10. The control method of claim 9, wherein the cabin is used for a burn-in test operation, and a temperature control component is disposed on the test platform and communicatively connected with the controller for adjusting the temperature of the target object.

11. The control method of claim 10, wherein the temperature control component includes at least one of a temperature increasing element and a temperature decreasing element.

12. The control method of claim 11, wherein the temperature increasing element is a heater.

13. The control method of claim 11, wherein the temperature decreasing element is at least one of a fan and a heat sink.

14. The control method of claim 10, wherein the controller defines a target temperature range, and when a test temperature indicated by the temperature signals of the temperature response structure fails to fall within the target temperature range, the temperature of the target object is adjusted by the temperature control component.

15. The control method of claim 9, wherein the controller defines a target temperature range, and when a test temperature indicated by the temperature signals of the temperature response structure fails to fall within the target temperature range, the internal pressure of the cabin is adjusted by the controller.

16. The control method of claim 9, further comprising collecting, by a database, power consumption data associated with the target object that are used by the controller to control the internal pressure of the cabin.

\* \* \* \* \*